(12) United States Patent
Sonoda et al.

(10) Patent No.: US 12,161,021 B2
(45) Date of Patent: Dec. 3, 2024

(54) DISPLAY DEVICE, MASK, AND METHOD FOR MANUFACTURING DISPLAY DEVICE

(71) Applicant: SHARP KABUSHIKI KAISHA, Sakai (JP)

(72) Inventors: Tohru Sonoda, Sakai (JP); Takashi Ochi, Sakai (JP); Hisao Ochi, Sakai (JP); Tsuyoshi Senzaki, Yonago (JP); Hideki Nakada, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 1052 days.

(21) Appl. No.: 17/042,835

(22) PCT Filed: Mar. 30, 2018

(86) PCT No.: PCT/JP2018/013966
§ 371 (c)(1),
(2) Date: Sep. 28, 2020

(87) PCT Pub. No.: WO2019/187148
PCT Pub. Date: Oct. 3, 2019

(65) Prior Publication Data
US 2021/0028256 A1    Jan. 28, 2021

(51) Int. Cl.
*H10K 59/122*    (2023.01)
*C23C 14/04*    (2006.01)
*H10K 71/00*    (2023.01)
*H10K 71/16*    (2023.01)

(52) U.S. Cl.
CPC ......... *H10K 59/122* (2023.02); *C23C 14/042* (2013.01); *H10K 71/00* (2023.02); *H10K 71/166* (2023.02)

(58) Field of Classification Search
CPC .. H10K 50/814; H10K 50/824; H10K 50/844; H10K 50/8445; H10K 50/8428; H10K 59/80516; H10K 59/80522; H10K 59/783; H10K 59/8731; H10K 59/8723
See application file for complete search history.

(56) References Cited

U.S. PATENT DOCUMENTS

2015/0060806 A1 *    3/2015    Park .................. H10K 59/122
                                                    257/40

FOREIGN PATENT DOCUMENTS

| CN | 106567052 A | 4/2017 |
| JP | 2009-259404 A | 11/2009 |
| JP | 2011-222146 A | 11/2011 |

* cited by examiner

*Primary Examiner* — Jesse Y Miyoshi
(74) *Attorney, Agent, or Firm* — ScienBiziP, P.C.

(57) ABSTRACT

A display device includes: a plurality of pixel-region mask spacers disposed in a pixel region where a plurality of pixels are disposed; a plurality of frame-region mask spacers disposed in a frame region outside the pixel region so as to surround the pixel region; and a common layer disposed on the plurality of pixel-region mask spacers, the common layer being common to the plurality of pixels, wherein the common layer comprises an end that has undulations in a plan view.

8 Claims, 10 Drawing Sheets

DISPLAY DEVICE, MASK, AND METHOD FOR MANUFACTURING DISPLAY DEVICE

TECHNICAL FIELD

The disclosure relates to a display device, a mask, and a method for manufacturing the display device.

BACKGROUND ART

As described in Patent Literature 1, producing a display device uses masks for forming individual layers onto a substrate. These masks include a fine metal mask (hereinafter referred to as an FMM) for forming a layer selectively for each pixel, and a common metal mask (hereinafter referred to as a CMM) or open mask (hereinafter referred to as a CMM) for forming a common layer common to all the pixels. In the film formation, the substrate and each mask are joined together closely by a magnetic force from a magnetic-force generating source, such as a magnet on the substrate backside.

CITATION LIST

Patent Literature

Patent Literature 1: Japanese Patent Application Laid-Open No. 2009-259404 (published on Nov. 5, 2009)

SUMMARY

Technical Problem

When the mask and substrate are joined together closely, the position of the mask can shift due to various factors, including a magnetic force, a misalignment, a tolerance of the substrate or mask, and a mispositioned alignment mark. An FMM has openings that correspond to pixels and are disposed in only necessary pixels. The FMM, when joined closely with the substrate, is held by mask spacers disposed inside and outside a pixel region provided with a plurality of pixels. A CMM in contrast has an opening that opens the entire pixel region. The CMM thus has a larger opening area than the FMM, and is held by only mask spacers outside the pixel region when joined closely with the substrate.

In occurrence of a mask position shift as described above, the CMM has an opening end more easily bent toward the substrate by its own weight or a magnetic force than the FMM. The CMM opening end bent toward the substrate by a magnetic force easily come into contact with mask spacers arranged in the direction of the position shift. The CMM opening end can have sticking foreign substances, such as a film consisting of deposited materials resulting from film formation, and a residue remaining unremoved after mask cleaning. These sticking foreign substances transfer to the mask spacers upon contact of the CMM opening end to the mask spacers. Such foreign substances cause dark spots and other problems, degrading the reliability of the display device.

In some cases, disposed between the interior mask spacers and exterior mask spacers is a region where a cathode is in contact with a wire routed in a TFT layer including TFTs that drive light-emitting elements. The opening end of a typical CMM is flush and has in plan view a linear shape, as described in Patent Literature 1. If the opening end of such a CMM shifts to the outside of the pixel region, a common layer formed using the CMM extends out to the outside of the pixel region uniformly. The common layer consequently closes the inside of the contact region, increasing the area of a region where the cathode and the routed wire cannot be in contact with each other, and increasing contact resistance. Such a problem leads to reliability degradation in the display device.

Solution to Problem

A display device according to one aspect of the disclosure includes the following: a plurality of pixel-region mask spacers disposed in a pixel region where a plurality of pixels are disposed; a plurality of frame-region mask spacers disposed in a frame region outside the pixel region so as to surround the pixel region; and a common layer disposed on the plurality of pixel-region mask spacers. The common layer is common to the plurality of pixels. The common layer has an end that has undulations in plan view.

A mask according to a further aspect of the disclosure has an opening that opens a pixel region where a plurality of pixels are disposed. The mask is used to form a common layer common to the plurality of pixels. The opening has an opening end that has undulations in plan view.

A method for manufacturing a display device according to a still further aspect includes forming a plurality of frame-region mask spacers in a frame region outside a pixel region so as to surround the pixel region. The pixel region is provided with a plurality of pixels. The method also includes the following: forming a plurality of pixel-region mask spacers in the pixel region; and bringing a mask into abutment with the plurality of frame-region mask spacers to form a common layer common to the plurality of pixels onto the plurality of pixel-region mask spacers. The mask has an opening that opens the pixel region and whose opening end has undulations in plan view.

Advantageous Effect of Disclosure

In the formation of the common layer, the aspects of the disclosure achieve a margin between the opening end of the mask, used to form the common layer common to the pixels, and the pixel-region mask spacers. In the formation of the common layer, the aspects thus prevent contact between the mask opening end and the pixel-region mask spacers or frame-region mask spacers even when the mask, used to form the common layer common to the pixels, is shifted to any direction with respect to the pixel-region mask spacers. This avoids a foreign substance from sticking to the pixel-region mask spacers or frame-region mask spacers even when it sticks to the mask opening end. In the formation of the common layer, the aspects of the disclosure reduces the area of a portion between the pixel-region mask spacers and the frame-region mask spacers that is not covered with the mask. In some cases, disposed between the pixel-region mask spacers and the frame-region mask spacers is a region where one of the electrodes of each light-emitting element is in contact with a wire routed in a TFT layer including TFTs that drive the light-emitting elements. Accordingly, in the formation of the common layer, such area reduction achieves a contact region even when the mask, used to form the common layer common to the pixels, is shifted toward the frame region with respect to the pixel-region mask spacers. The aspects consequently offer a display device more reliable than ever before, a mask with which such a more reliable display device can be manufactured, and a method for manufacturing such a more reliable display device.

DESCRIPTION OF EMBODIMENTS

An embodiment of the disclosure will be detailed. Components having the same functions as previously described components will be denoted by the same signs and will not be elaborated in the following embodiments.

Figure 1:
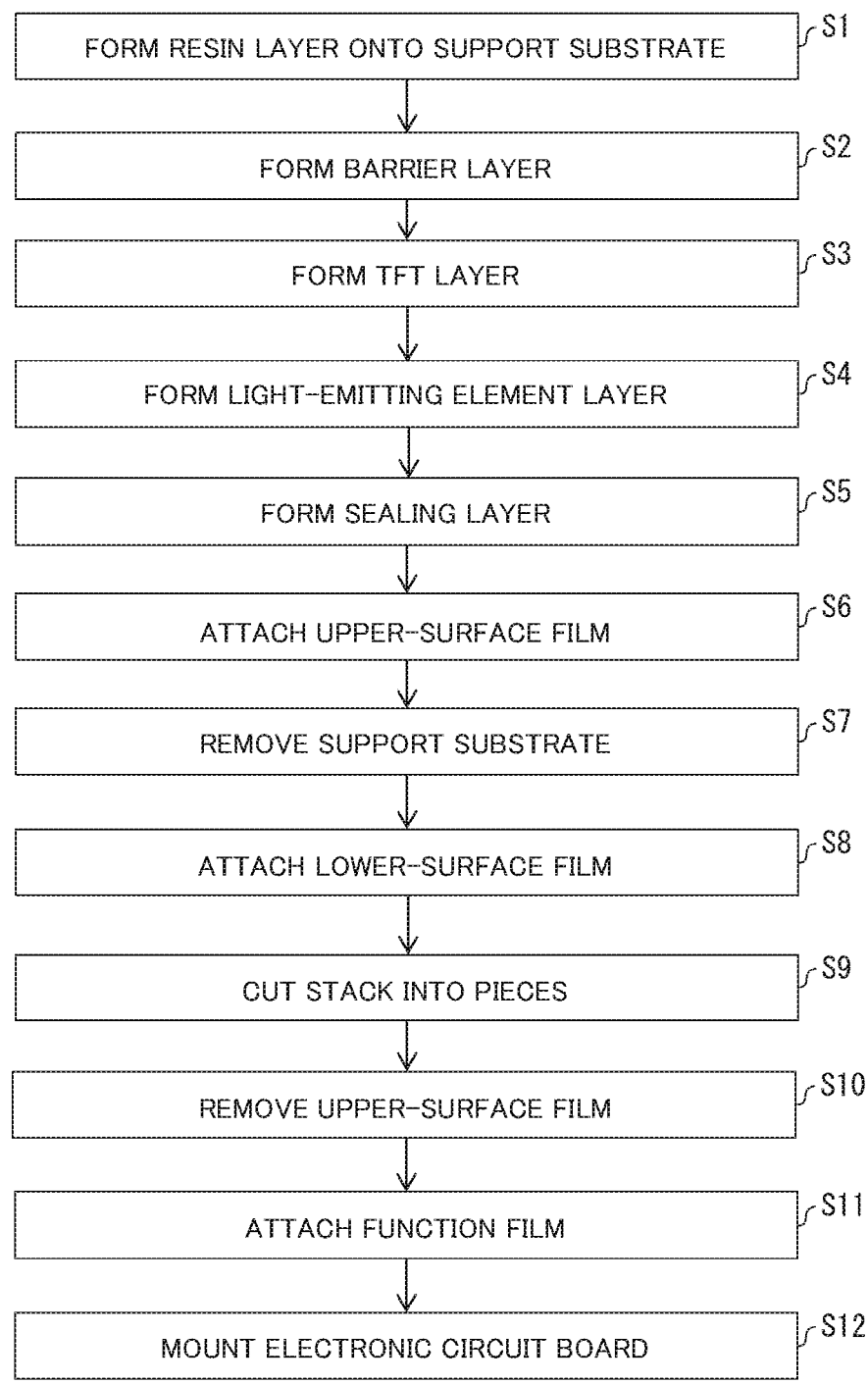
FIG. 1 is a flowchart illustrating an example method for manufacturing a display device according to one embodiment.
Figure 2:
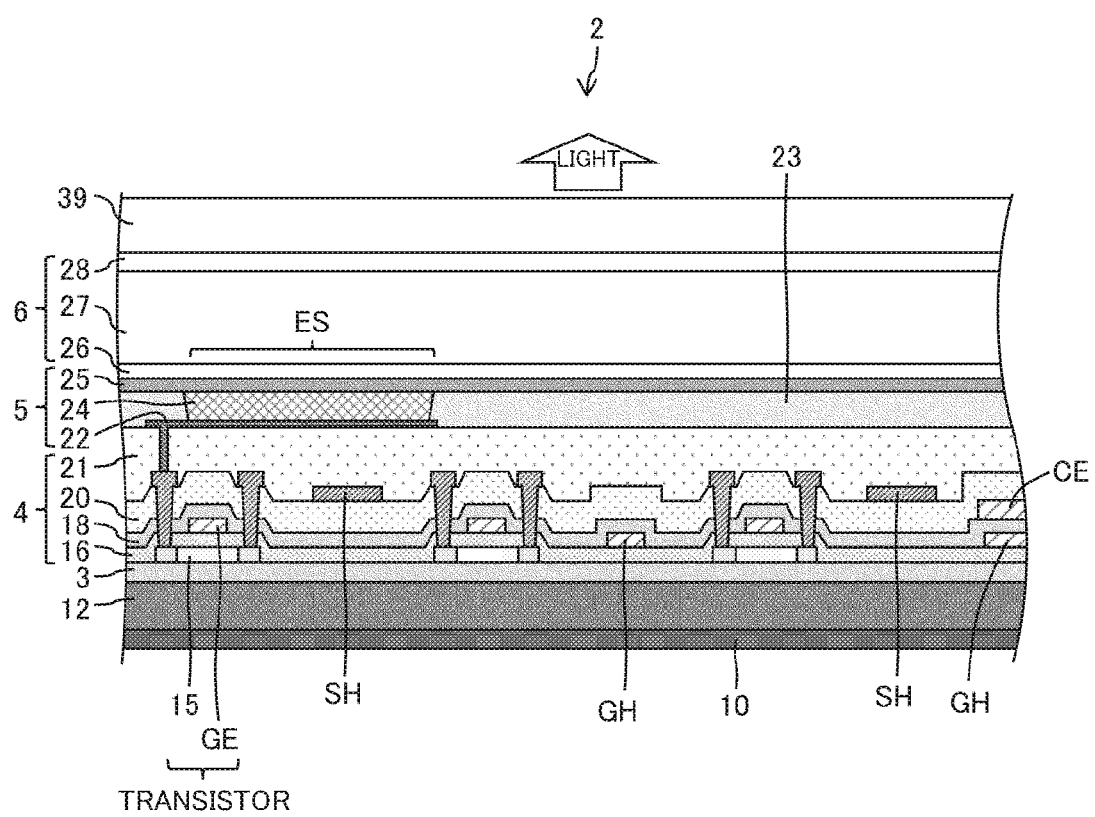
FIG. 2 is a cross-sectional view of the configuration of a pixel region of the display device according to the embodiment.
Figure 3:
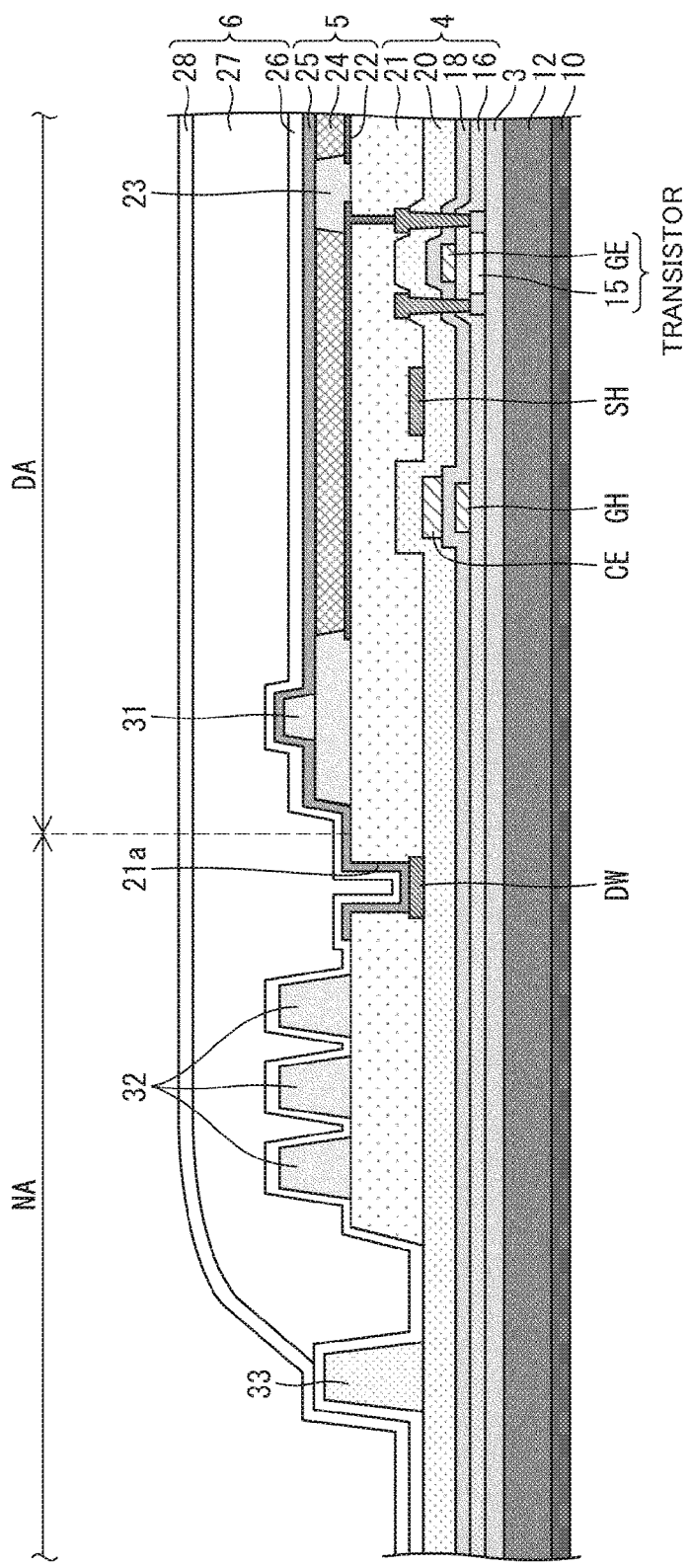
FIG. 3 is a cross-sectional view of the configuration of a frame region and its neighborhood of the display device according to the embodiment.

Outline of Configuration of Display Device and Outline of How to Manufacture the Same FIG. 1 is a flowchart illustrating an example method for manufacturing a display device 2 according to this embodiment. FIG. 2 is a cross-sectional view of the configuration of a pixel region (display region) of the display device 2 according to the embodiment. FIG. 3 is a cross-sectional view of the configuration of a frame region NA and its neighborhood of the display device 2 according to the embodiment. The term "in the same layer" hereinafter refers to that one layer is formed in the same process step (film formation step) as another thing. The term "in a lower position than" hereinafter refers to that one layer is formed in a process step anterior to a process step of forming the comparative layer. The term "in a higher position than" hereinafter refers to that one layer is formed in a process step posterior to a process step of forming the comparative layer.

A method for manufacturing the display device 2, which is flexible, includes the following process steps in sequence as illustrated in FIGS. 1 to 3: Step S1 of forming a resin layer 12 onto a translucent support substrate (e.g., a mother glass substrate); Step 2 of forming a barrier layer 3; Step S3 of forming a TFT layer 4; Step S4 of forming a light-emitting element layer 5; Step S5 of forming a sealing layer 6; and Step S6 of temporarily attaching a protective, upper-surface film to the sealing layer 6.

The method also includes the following process steps in sequence: Step S7 of removing the support substrate from the resin layer 12 by laser light irradiation or other methods; Step S8 of attaching a lower-surface film 10 to the lower surface of the resin layer 12; Step S9 of cutting a stack of the lower film 10, resin layer 12, barrier layer 3, TFT layer 4, light-emitting-element layer 5, and sealing layer 6 into a plurality of pieces; Step S10 of removing the upper film from the resultant pieces; Step S11 of attaching a function film 39 to the resultant pieces; and Step S12 of mounting an electronic circuit board (e.g., an IC chip and an FPC) onto a part (a terminal) of a region (a frame region NA; see FIG. 3) that is outside pixel regions DA (see FIG. 3) where a plurality of pixels are disposed. Steps S1 to S12 are performed by an apparatus that manufactures the display device (including a film formation apparatus that performs Steps S1 to S5).

The resin layer 12 is made of, but not limited to, polyimide. The resin layer 12 can be replaced with a set of two resin films (e.g., polyimide films) and one inorganic insulating film sandwiched between these resin films.

The barrier layer 3 prevents foreign substances, such as water and oxygen, from entering the TFT layer 4 and light-emitting-element layer 5. The barrier layer 3 can be composed of a silicon oxide film, a silicon nitride film, or a silicon oxide nitride film, all of which are formed through CVD, or can be composed of a stack of these layers.

The TFT layer 4 includes the following components: a semiconductor film 15; an inorganic insulating film 16 (a gate insulating film) in a higher position than the semiconductor film 15; a gate electrode GE and gate line GH in a higher position than the inorganic insulating film 16; an inorganic insulating film 18 in a higher position than the gate electrode GE and the gate wire GH; a power-source wire CE in a higher position than the inorganic insulating film 18; an inorganic insulating film 20 in a higher position than the power-source wire CE; a source wire SH in a higher position than the inorganic insulating film 20; and a flattening film 21 (an interlayer insulating film) in a higher position than the source wire SH.

The semiconductor film 15 is made of, but not limited to, low-temperature polysilicon (LTPS) or oxide semiconductor (e.g., In—Ga—Zn—O semiconductor). Together with the gate electrode GE, the semiconductor film 15 forms a transistor (herein a TFT). Although the transistor has a top-gate structure in FIG. 2, it may have a bottom-gate structure.

The gate electrode GE, gate wire GH, power-source wire CE, and source wire SH are each composed of a monolayer film of metal including at least one of, for instance, aluminum, tungsten, molybdenum, tantalum, chromium, titanium, and copper; alternatively these components are each composed of a laminated films of these materials. The TFT layer 4 in FIG. 2 includes one semiconductor layer and three metal layers.

The inorganic insulating films 16, 18, and 19 each can be composed of a silicon oxide (SiOx) film or a silicon nitride (SiNx) film, both of which are formed through CVD, or each can be composed of a laminated layer of these films. The flattening film 21 can be made of photosensitive organic material that can be applied, such as polyimide or acrylic.

The light-emitting-element layer 5 includes the following components: an anode 22 in a higher position than the flattening film 21; an edge cover 23 that is insulating and covering the edge of the anode 22; an electroluminescence (EL) layer 24 in a higher position than the edge cover 23; a cathode 25 in a higher position than the EL layer 24; and mask spacers 31 and 32. The light-emitting element layer 5 may also include a capping layer, such as an organic capping layer or an inorganic capping layer, in a higher position than the cathode 25.

The edge cover 23 contains an organic material (such as polyimide or acrylic) patterned through photolithography after application.

For each pixel, the anode 22, EL layer 24, and cathode 25 constitute a light-emitting element ES (e.g., an organic light-emitting diode or OLED for short, and a quantum-dot light-emitting diode or QLED for short) in the light-emitting element layer 5. The light-emitting element ES is controlled by a pixel circuit disposed in the TFT layer 4.

The anode 22 is a patterned electrode provided in the form of an island for each pixel. The cathode 25 is a common electrode provided in a flat manner and common to all the pixels, and is disposed all over the pixel regions DA rather than provided individually for each pixel.

The cathode 25 is formed through vapor deposition mainly, whereas the anode 22 is formed through sputtering mainly. The cathode formation through vapor deposition uses a deposition mask, which is herein an open mask called a common metal mask (CMM) having an opening that opens the entire pixel region DA.

The EL layer 24 is composed of, but not limited to, a set of the following function layers sequentially stacked from below: a hole injection layer, a common hole transport layer, an island-shaped hole transport layer, a light-emitting layer, a hole blocking layer, an electron transport layer, and an electron injection layer. The light-emitting layer is provided in the form of islands in the openings of the edge cover 23 (i.e., for each pixel) for instance, through a vapor deposition method or an ink-jet method.

Forming a light-emitting layer of an OLED uses vapor deposition with a deposition mask, which is herein a fine metal mask (FMM) for instance, thus forming a vapor-deposited layer in the form of islands. Forming a light-emitting layer of a QLED uses ink-jet application of a solvent containing diffused quantum dots for instance. For an OLED that emits white light, or in forming a common light-emitting layer common to a plurality of pixels, an open mask called a common metal mask (CMM) can be used as a deposition mask.

The island-shaped hole transport layer is in the form of islands formed through vapor deposition with an FMM. The other function layers are provided either in the form of islands or in a flat manner as common layers formed through vapor deposition with an FMM or CMM. These function layers each may be an organic layer of organic material or an inorganic film of inorganic material.

The capping layer is provided in a flat manner as a common layer formed through vapor deposition with a CMM. For instance, the capping layer may have a stacked structure of, in sequence, an organic capping layer of organic material and an inorganic capping layer of inorganic material; alternatively; the capping layer ay be composed of only one of the two layers.

One or more of the hole injection layer, common hole transport layer, island-shaped hole transport layer, light-emitting layer, hole blocking layer, electron transport layer, and electron injection layer can be omitted; alternatively, another layer can be provided additionally.

For instance, the anode 22 is composed of a stacked layer of indium tin oxide (ITO) and silver (Ag) or is composed of a stacked layer of ITO and Ag-containing alloy. The anode 22 reflects light. The cathode 25 can be composed of a translucent conductor, such as a MgAg alloy (extremely thin film), an ITO, or an indium zinc oxide (IZO).

When the light-emitting element ES is an OLED, a drive current between the anode 22 and cathode 25 rejoins holes and electrons within the light-emitting layer, thus generating excitons. These excitons emit light in the process of transition to a ground state. When the cathode 25 transmits light, and the anode 22 reflects tight, the light from the EL layer 24 travels upward and goes out from the top. When the cathode 25 reflects light, and the anode 22 transmits light, the light from the EL layer 24 travels downward and goes out from the bottom.

When the light-emitting element ES is a QLED, a drive current between the anode 22 and cathode 25 rejoins holes and electrons within the light-emitting layer, thus generating excitons. These excitons emit light (fluorescent light) in the process of transition from a conduction band level of the quantum dots to a valence band level of the quantum dots.

The light-emitting-element layer 5 may include light-emitting elements ES (e.g., inorganic light-emitting diodes) other than OLEDs and QLEDs as described above.

The mask spacers 31 are pixel-region mask spacers disposed in each pixel region DA, as illustrated in FIG. 3. In addition, the mask spacers 32 are frame-region mask spacers disposed in the frame region NA and surrounding the pixel region DA. The mask spacers 31 are disposed between adjacent anode-exposed portions (openings of the edge cover 23 where the anode 22 is exposed) in each pixel. In some embodiments, the pixel region DA may have dummy pixels surrounding display pixels, or may have display pixels alone. The anode-exposed portions in each display pixel function as light-emission regions of the light-emitting element ES. To be specific, the mask spacers 31 are disposed in a predetermined portion of the edge cover 23 so as to protrude toward the cathode 25 (i.e., in a direction remote from the TFT layer 4). The mask spacers 31 are not shown in FIG. 2.

The mask spacers 31 hold an FMM in film formation using the FMM. The mask spacers 32 hold the FMM in film formation using the FMM and hold a CMM in film formation using the CMM. The FMM is thus held by the mask spacers 31 and 32 in film formation (in other words, in joining together of a film and a target substrate closely). In addition, the CMM is thus held by the mask spacers 32 in film formation (in other words, in joining together of a film and the target substrate closely).

The mask spacers 31 and 32 are made of photosensitive resin for instance. The mask spacers 31 and 32 may be made of material identical to or different from that of the edge cover 23.

The sealing layer 6 is translucent. The sealing layer 6 includes an inorganic sealing layer 26 covering the cathode 25, an organic buffer film 27 in a higher position than the inorganic sealing layer 26, and an inorganic sealing film 28 in a higher position than the organic buffer film 27. The sealing layer 6, which covers the light-emitting-element layer 5, prevents foreign substances, such as water and oxygen, from penetrating the light-emitting-element layer 5.

Each of the inorganic sealing layers 26 and 28 is an inorganic insulating film. Each of the inorganic sealing layers 26 and 28 can be composed of a silicon oxide film, a silicon nitride film, or a silicon oxide nitride film, all of which are formed through CVD, or can be composed of a stack of these films. The organic buffer film 27 is a translucent organic film that flattens a film, and can be made of organic material that can be applied, such as acrylic. The organic buffer film 27 can be formed through ink-jet application for instance. To stop ink droplets, the frame region NA may have a frame-shaped bank 33 and another frame-shaped bank (not shown) surrounding the bank 33, as illustrated in FIG. 3. The bank 33 can be formed at the same time using the same material as the edge cover 23 and mask spacers 31 and 32. The other frame-shaped bank (not shown) around the bank 33 has a 2-ply structure consisting of lower and upper layers for instance. The lower layer can be made of the same material as the flattening film 21 and formed at the same time as pattern formation of the flattening film 21. The upper layer can be formed at the same time using the same material as the edge cover 23 and mask spacers 31 and 32 for instance.

The lower film 10 is, but not limited to, a PET film attached to the lower surface of the resin layer 12 after the removal of the support substrate, thus achieving a highly flexible display device. The function film 39 serves as, but not limited to, at least one of an optical compensator, a touch sensor, and a protector.

The foregoing has described a flexible display device. Producing a non-flexible display device, which typically does not require formation of a resin layer and replacement of a base material, involves Steps S2 to S5 of stacking layers onto a glass substrate, followed by Step S9 for instance.

As described above, the display device 2 according to the embodiment has at least one common layer disposed all over the pixel regions DA in a flat manner and common to all the pixels (i.e., a plurality of pixels).

Figure 4:
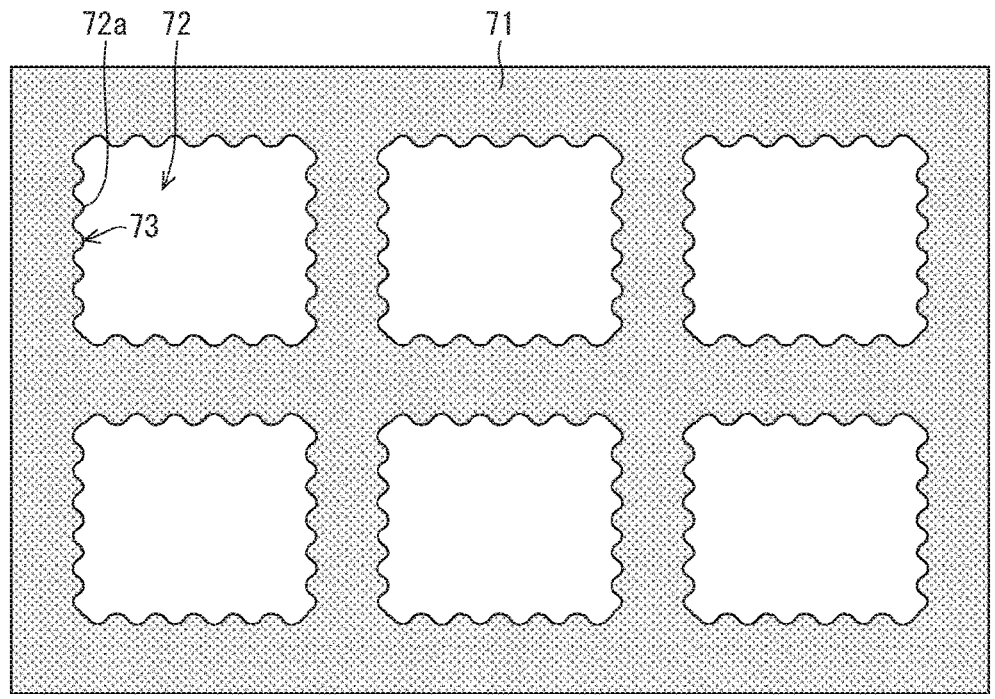
FIG. 4 is a plan view of an example mask that is used to form a common layer of the display device according to the embodiment.
Figure 5:
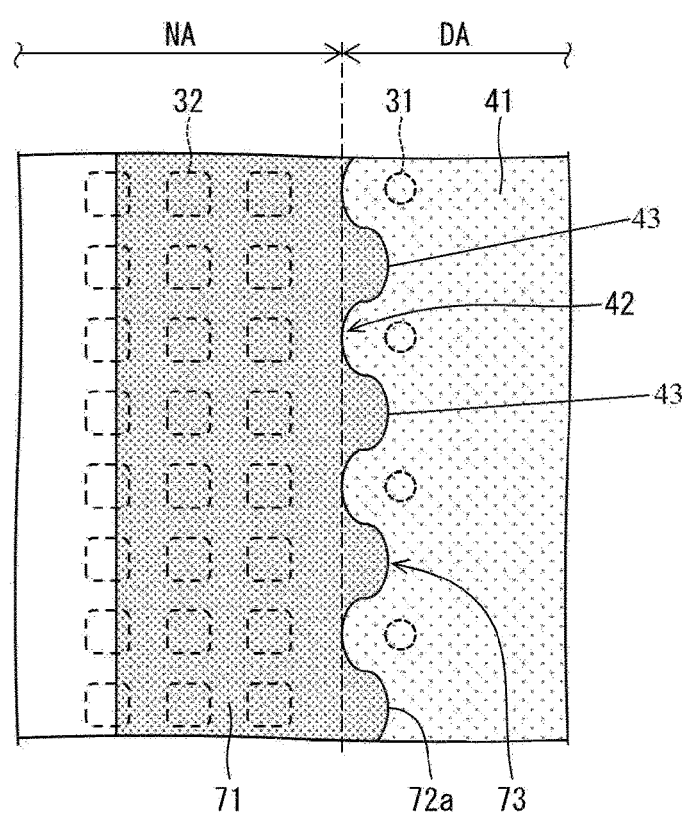
FIG. 5 illustrates how the common layer of the display device according to the embodiment is formed using the mask illustrated in FIG. 4.

FIG. 4 is a plan view of an example mask 71 that is used to form a common layer of the display device 2 according to the embodiment. FIG. 5 illustrates how a common layer 41 of the display device 2 according to the embodiment is formed using the mask 71 in FIG. 4.

The mask 71 is an open mask called a CMM, which is used to form a common layer common to all the pixels as described above. As illustrated in FIGS. 4 and 5, the ask 71 has openings 72 each of which opens the entire pixel region DA that at least includes a display region where a display pixel is disposed.

As illustrated in FIG. 4, the film formation requires a single mask 71 for multiple pixel regions DA of the display device 2 on the support substrate (mother substrate) that have been cut into pieces in Step S9, as described above. In some cases, the mask 71 may have only one opening 72.

As illustrated in FIGS. 4 and 5, each opening 72 has an opening end 72a provided with undulations 73 that consist of depressions and protrusions repeatedly arranged in plan view. As illustrated in FIG. 5, the intervals (cycles) between the undulations 73, that is, the interval between the adjacent protrusions of the undulations 73 and the interval between the adjacent depressions of the same, are equal to, for instance, the intervals between the mask spacers 31 (i.e., the distance between the adjacent mask spacers 31). In addition, the intervals between the mask spacers 32 (i.e., the distance between the adjacent mask spacers 32) are smaller than the intervals between the mask spacers 31. The example mask spacers 32 in FIG. 5 are arranged at half the intervals between the mask spacers 31. For instance, each mask spacer 31 is a 1.0 to 2.0 μm high, tapered cylindrical column whose upper surface, which abuts on the FMM, is a circle that is 5 to 10 μm in diameter. For instance, each mask spacer 32 is a 1.0 to 2.0 μm high, tapered quadrangular prism whose upper surface, which abuts on the FMM and CMM, is a quadrangle (e.g., a square) having four sides each of which is 10 to 15 μm long. Herein, the heights of the mask spacers 31 and 32 are measured with reference to the upper surface of the flattening film 21, which means that these heights are measured from the upper surface of the flattening film 21.

The opening end 72a of the opening 72 (i.e., the undulations 73) has a wavy shape in conformance with the arrangement of the mask spacers 31 so as to be away from the mask spacers 31 by equal to or greater than a predetermined distance. The undulations 73 are provided in such a manner that their protrusions are located between the mask spacers 31 adjacent to the frame region NA when the mask 71 and target substrate are overlaid with each other.

The mask 71 is thus provided in such a manner that the protrusions of the undulations 73 are located between the mask spacers 31 adjacent to the frame region NA when the mask 71 and target substrate are joined together closely. Placing the mask 71 properly with respect to the mask spacers 31 provides equal to or greater than a predetermined distance between the undulations 73 and the mask spacers 31 adjacent to the frame region NA.

The common layer 41 is disposed in the opening 72 of the mask 71. The common layer 41 thus has, at its end, undulations 42 that correspond to the undulations 73 of the mask 71 in plan view. That is, the end of the common layer 41 consists of depressions 43 of the undulations 42 disposed along and facing the protrusions of the undulations 73, and protrusions of the undulations 42 disposed along and facing the depressions of the undulations 73. The undulations 42 thus have a wavy shape for instance corresponding to the undulations 73. The intervals of the undulations 42 are identical to the intervals of the undulations 73 and equal to the intervals of the mask spacers 31. The common layer 41 is disposed on the mask spacers 31 in such a manner that the depressions of the undulations 42 are located between the mask spacers 31 adjacent to the frame region NA. The common layer 41 is common to the plurality of pixels.

A method for manufacturing the display device 2 according to the embodiment includes the following process steps: forming the plurality of mask spacers 32 in the frame region NA outside the pixel region DA so as to surround the pixel region DA; forming the plurality of mask spacers 31 in the pixel region DA; and bringing the mask 71 into abutment with the mask spacers 31 to form the common layer 41 common to the plurality of pixels onto the mask spacers 31. The mask 71 has the opening 72 that opens the pixel region DA and whose opening end 72a has the undulations 73 in plan view.

This embodiment avoids contact between the opening end 72a of the mask 71 and the mask spacers 31 in any positional shift of the mask 71 that can occur when the mask 71 and target substrate are joined together closely. Such contact avoidance prevents a foreign substance from adhesion.

The shape of the undulations 73 is not limited to a wavy shape. The undulations 73 need to have a shape that maintains equal to or greater than a predetermined distance between the mask spacers 31 in the pixel region DA and the undulations 73 (i.e., the opening end 72a of the mask 71).

The mask spacers 31 are arranged as before in order to hold the FMM uniformly. This embodiment includes changing the shape of the opening end 72a of the mask 71 rather than changing the arrangement of the mask spacers 31 from their previous arrangement, thus manufacturing the display device 2 that has higher reliability than a known display device.

The mask spacers 32 in the frame region NA may be arranged in such a manner that equal to or greater than a predetermined distance is maintained between the mask spacers 32 and the undulations 73 (or opening end 72a).

Figure 6:
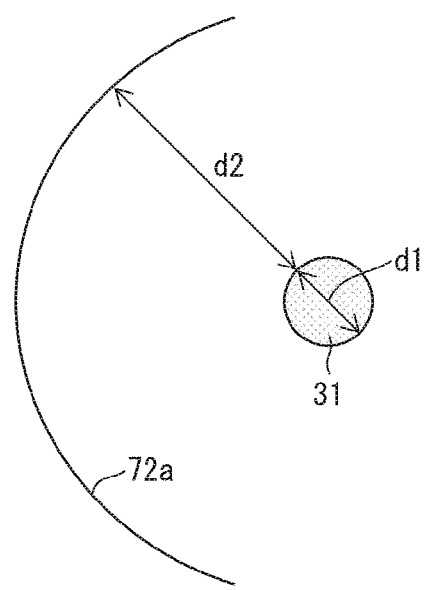
FIG. 6 schematically illustrates the relationship between mask spacers and an opening end of the mask illustrated in FIG. 4.

FIG. 6 schematically illustrates the relationship between each mask spacer 31 and the opening end 72a of the mask 71 illustrated in FIG. 4. In FIG. 6, the mask spacer 31 has a diameter d1, and the opening end 72a of the mask 71 has such a wavy shape as to be, by a distance d2, away from the end of the mask spacer 31, which faces the opening end 72a. Each dent of the undulations 73 in this case forms a segment of a circle having a radius R expressed as d2+d1/2. Herein, let the diameter d1 be set to 10 μm; in addition, let the distance d2 be set to 50 μm by reflecting processing accuracy in the mask 71 and mask shifting. The radius R is accordingly expressed as R=50+10/2=55 μm.

The mask 71 undergoes patterning through etching including a photolithography and etching process from its front and back surfaces. Even at an exposure resolution of 3 μm (ghi-line) in the photolithography, the size of the aforementioned wavy shape is sufficiently large, facilitating fine processing into such a wavy shape as described above.

Figure 7:
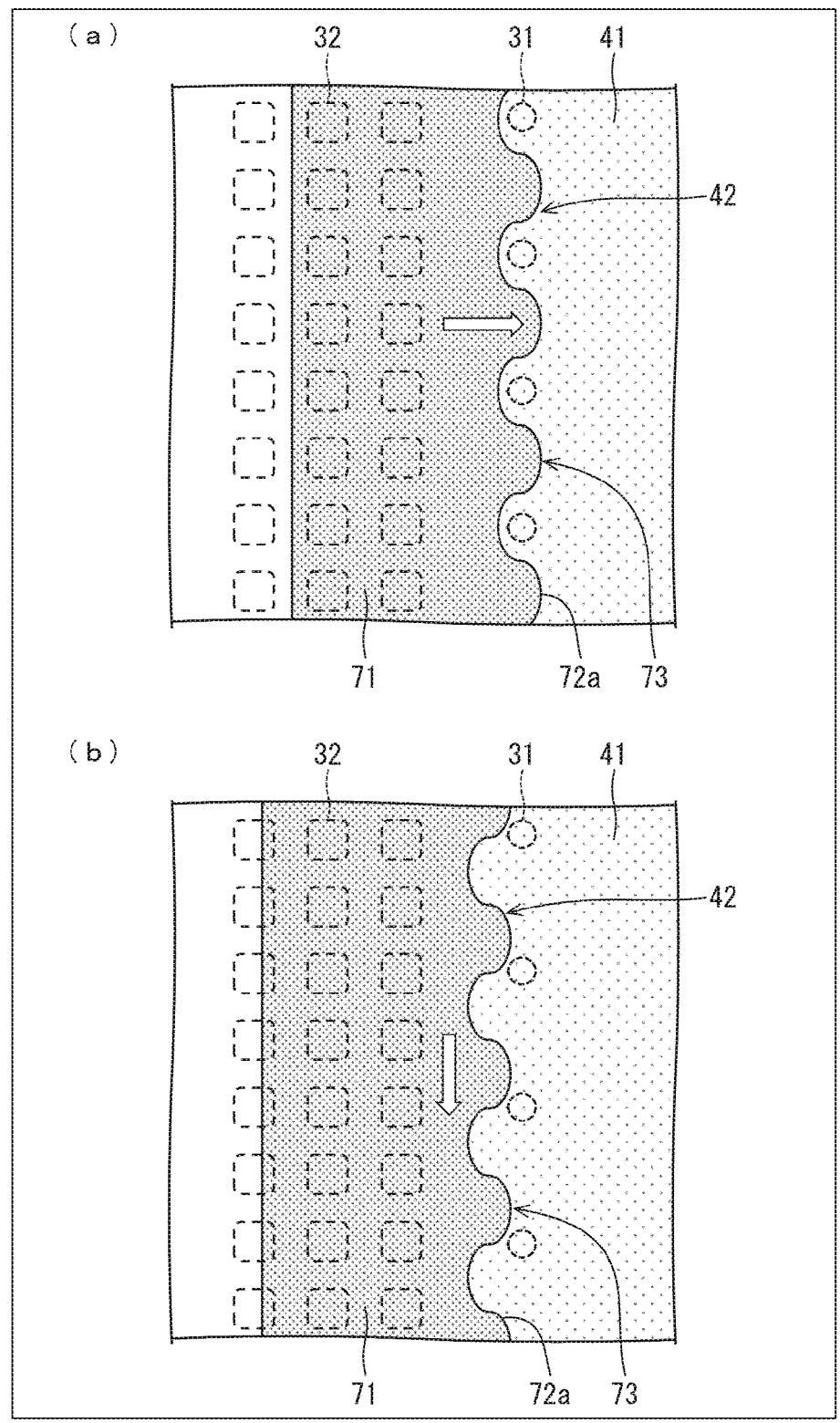
FIG. 7(a) schematically illustrates in plan view where the opening end of the mask in FIG. 4 shifted toward the pixel region is located in relation to pixel-region mask spacers.
FIG. 7(b) schematically illustrates in plan view where the opening end of the mask in FIG. 4, with its protrusions between the pixel-region mask spacers adjacent to a frame region being shifted toward the pixel-region mask spacers sandwiching the protrusions, is located in relation to the pixel-region mask spacers.
Figure 11:
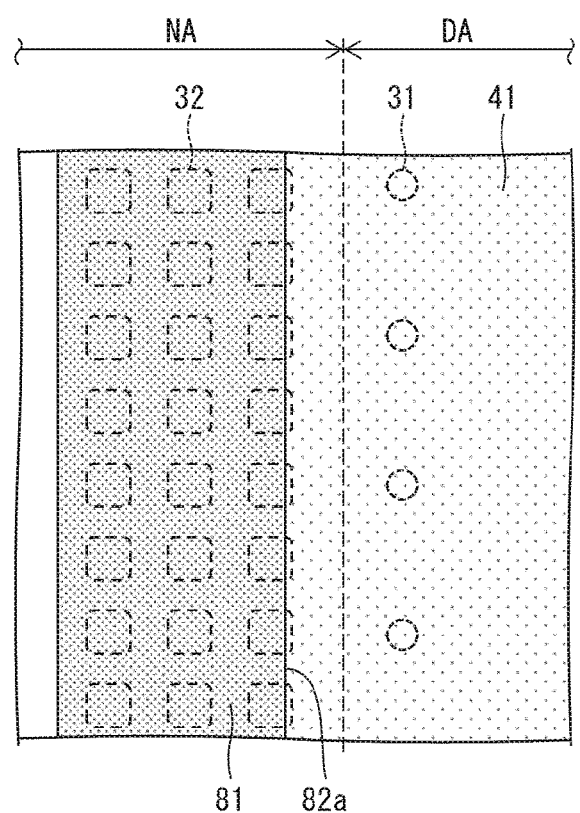
FIG. 11 illustrates in plan view where the opening end of the mask in FIG. 10(a) shifted toward the frame region is located in relation to the pixel-region mask spacers.

With reference to FIG. 7(a), FIG. 7(b), and FIG. 11, the following further details effects that are obtained by formation of a common layer using the mask 71.

FIG. 7(a) schematically illustrates in plan view where the opening end 72a of the mask 71 in FIG. 4 shifted toward the pixel region DA is located in relation to the mask spacers 31. FIG. 7(b) schematically illustrates in plan view where the opening end 72a of the mask 71 in FIG. 4, with its protrusions, which are located between the pixel-region mask spacers 31 adjacent to the frame region NA, being shifted toward the mask spacers 31, which sandwich the protrusions, is located in relation to the mask spacers 31.

Figure 8:
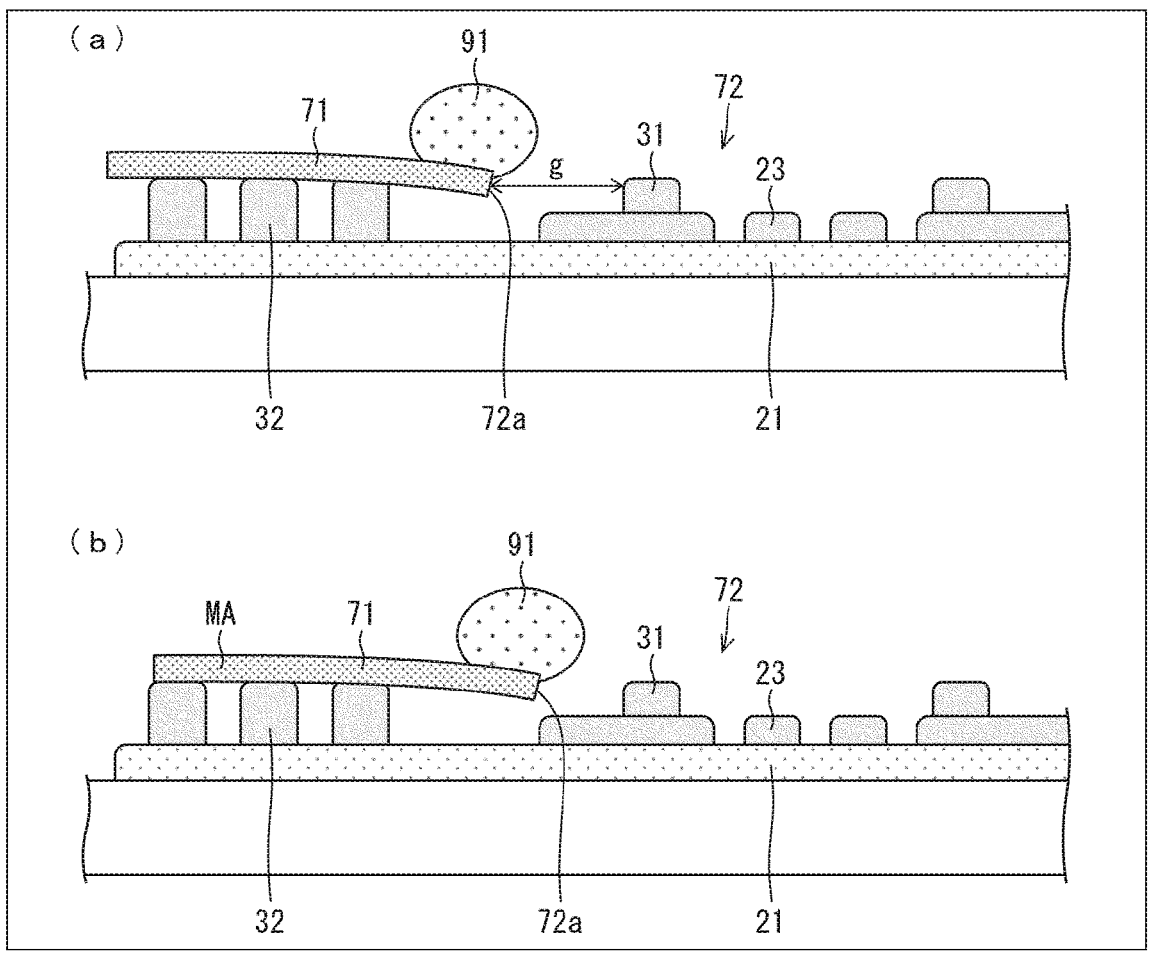
FIG. 8(a) schematically illustrates in cross-sectional view where the opening end of the mask in FIG. 4 disposed properly with respect to the pixel-region mask spacers is located in relation to the pixel-region mask spacers.
FIG. 8(b) schematically illustrates in cross-sectional view where the opening end of the mask in FIG. 8(a) shifted toward the pixel region is located in relation to the pixel-region mask spacers.

FIG. 8(a) schematically illustrates in cross-sectional view where the opening end 72a of the mask 71 in FIG. 4 disposed properly with respect to the mask spacers 31 is located in relation to the mask spacers 31. FIG. 8(b) schematically illustrates in cross-sectional view where the opening end 72a of the mask 71 in FIG. 8(a) shifted toward the pixel region DA is located in relation to the mask spacers 31.

Figure 10:
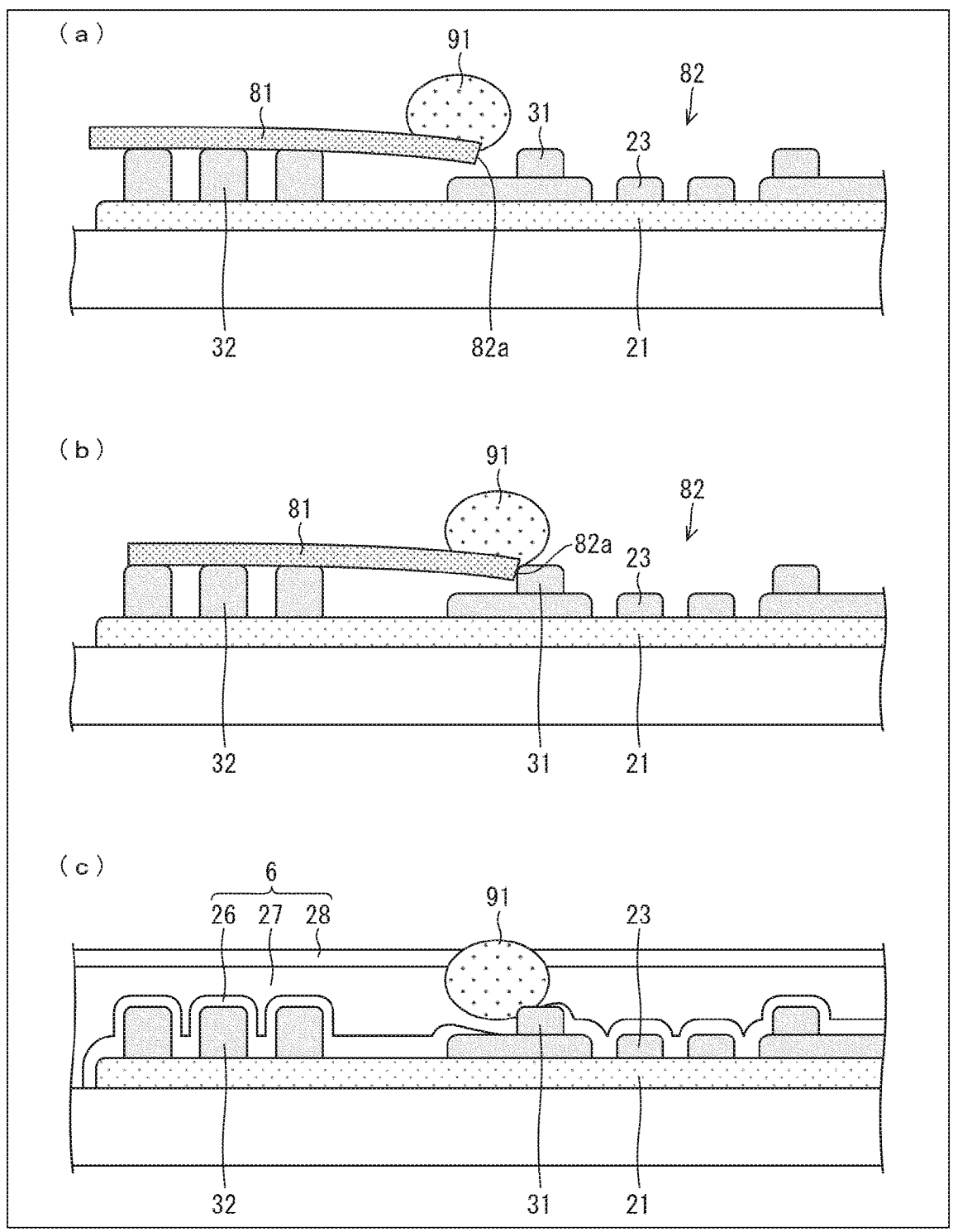
FIG. 10(a) schematically illustrates in cross-sectional view where the opening of a mask (CMM) whose opening end has a linear shape in plan view and that is disposed properly with respect to the pixel-region mask spacers is located in relation to the pixel-region mask spacers.
FIG. 10(b) schematically illustrates in cross-sectional view where the opening end of the mask in FIG. 10(a) shifted toward the pixel region is located in relation to the pixel-region mask spacers.
FIG. 10(c) schematically illustrates in cross-sectional view what happens unfavorably when the common layer is formed in the situation shown in FIG. 10(b) and is then sealed with a sealing layer.

The mask 71 can be replaced with a mask 81 (i.e., a CMM) having an opening 82 whose opening end 82a has a linear shape in plan view. FIG. 10(a) schematically illustrates in cross-sectional view where the opening 82 of the mask 81 disposed properly with respect to the mask spacers 31 is located in relation to the mask spacers 31. FIG. 10(b) schematically illustrates in cross-sectional view where the opening end 82a of the mask 81 in FIG. 10(a) shifted toward the pixel region DA is located in relation to the mask spacers 31. FIG. 10(c) schematically illustrates in cross-sectional view what happens unfavorably when a common layer (not shown) is formed in the situation shown in FIG. 10(b) and is then sealed with the sealing layer 6.

The opening end 72a of the mask 71 and the opening end 82a of the mask 81, in particular, the opening ends 72a and 82a of the respective masks 71 and 81 each of which is a CMM for forming the individual function layers (e.g., an organic film) in the EL layer 24, are located close, to the maximum extent, to the perimeter of the pixel region DA including the dummy pixels. As illustrated in FIGS. 8(a) and 10(a), the opening end 72a of the mask 71 and the opening end 82a of the mask 81 can have a sticking foreign substance 91, such as a film consisting of deposited materials resulting from film formation, and a residue remaining unremoved after mask cleaning.

Placing a magnetic-force generating source, such as a magnet (magnet plate), onto the back surface of the target substrate for instance, followed by attracting the middle of the mask 71 or 81, which is supple, with the magnet to eliminate the gap between the mask 71 or 81 and the target substrate causes the magnetic force to bring the target substrate and the mask 71 or 81 into close contact with each other when the common layer 41 is formed.

The masks 71 and 81 have their openings each of which is greater in area than that of an FMM. Each of the masks 71 and 81, when closely joined with the target substrate, is held by only the mask spacers 32, which are disposed in the frame region NA.

The opening end 72a of the mask 71 and the opening end 82a of the mask 81 are hence more easily bent toward the target substrate by their own weights or the magnetic force than that of an FMM when a position shift occurs in closely joining the mask 71 or 81 and the target substrate together.

For this reason, the opening end 82a bent toward the target substrate comes into contact with the mask spacer 31 upon the mask 81 being shifted by the magnetic force from its position shown in FIG. 10(a) toward the pixel region DA, as shown in FIG. 10(b) when the mask 81 and target substrate are joined together closely. The foreign substance 91 on the opening end 82a consequently transfers to the mask spacer 31.

Reference is made to an instance where the common layer 41 is such a function layer as earlier described that is included in the EL layer 24 (e.g., an organic film), and where the light-emitting element layer 5 including the common layer 41 is sealed with the sealing layer 6, as illustrated in FIG. 10(c) after the common layer 41 is formed.

In a situation like FIG. 10(c), where the foreign substance 91 having some height is sticking on the mask spacer 31 having already some height, the foreign substance 91 cannot be covered with the sealing layer 6 properly and is thus partly exposed from the sealing layer 6 when the light-emitting element layer 5 is sealed with the sealing layer 6. This missing part forms a path of water penetration, from which water penetrates and reaches the light-emitting element ES, thus generating a dark spot. This degrades the reliability of a display device manufactured using the foregoing mask 81.

In contrast, the display device in the present embodiment is configured such that the opening end 72a of the mask 71 has the undulations 73 having, for instance, a wavy shape so that the opening end 72a of the mask 71 and the mask spacers 31 are away from each other by equal to or greater than a predetermined distance. In addition, the distance g (expressed as g=R=d2+d1/2) between the opening end 72a of the mask 71 and each mask spacer 31, shown in FIG. 8(a), is designed including mask accuracy and mask shifting. The opening end 72a and the mask spacers 31 consequently do not come into contact with each other even when the mask 71 is shifted with respect to the mask spacers 31, as shown in FIGS. 7(a) and (b) and FIG. 8(b). The present embodiment thus prevents removal of the foreign substance 91 from the mask 71, reducing the foreign substance 91 that cannot be covered with the sealing layer 6 and offering a highly reliable display device and improved yields.

Figure 9:
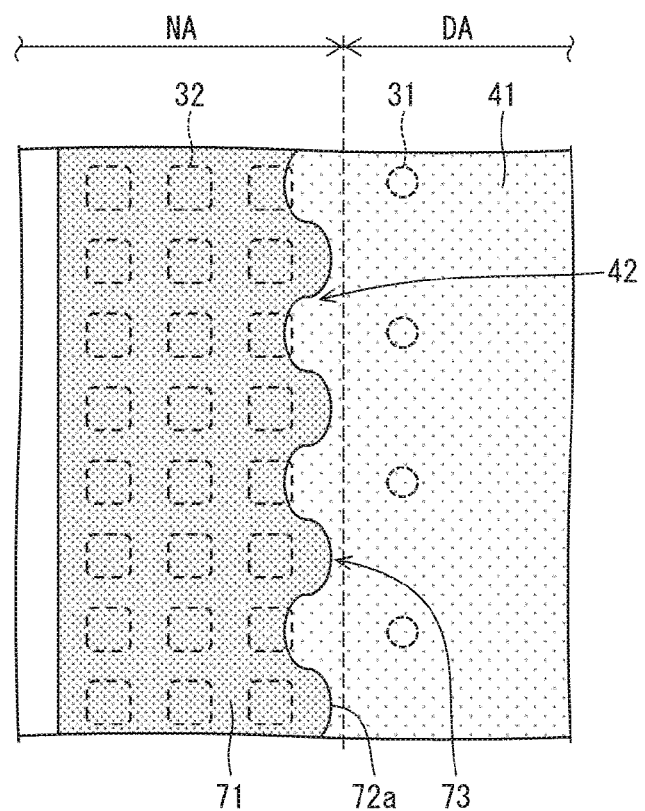
FIG. 9 illustrates in plan view where the opening end of the mask in FIG. 4 shifted toward the frame region is located in relation to the pixel-region mask spacers.

FIG. 9 illustrates in plan view where the opening end 72a of the mask 71 in FIG. 4 shifted toward the frame region NA is located in relation to the mask spacers 31. FIG. 11 illustrates in plan view where the opening end 82a of the mask 81 in FIG. 10(a) shifted toward the frame region NA is located in relation to the mask spacers 31.

Reference is made to FIG. 11, where the mask 81 having the opening end 82a is used as a CMM. The opening end 82a, which has a linear shape, comes into contact with many mask spacers 32 when shifted toward the frame region NA, highly probably causing the foreign substance 91 to stick to the mask spacers 32.

Referring to FIG. 3, the display device can have a trench 21 between the mask spacers 31 and 32. The trench 21 is a region where the cathode 25 is in conflict with a wire DW routed in the TFT layer 4.

In this case, the common layer 41 formed using the mask 81 extends out uniformly to the frame region NA upon the opening end 82a of the mask 81 being shifted toward the frame region NA, as shown in FIG. 11. The common layer 41 accordingly closes the inside of the trench 21a uniformly, increasing the area of a region where the cathode 25 cannot be in contact with the routed wire DW.

The opening end 72a of the mask 71 in contrast, which has the undulations 73, comes into contact with fewer mask spacers 32 than the opening end 82a shifted toward the frame region NA does, as shown in FIG. 9 even when the opening end 72a is shifted toward the frame region NA as much as the opening end 82a of the mask 81 in FIG. 11. Using the mask 71 as a CMM thus prevents the foreign substance 91 from sticking to the mask spacers 32 when compared to using the mask 81 as a CMM.

In this embodiment, the common layer 41 has at its end the undulations 42 corresponding to the undulations 73, as shown in FIG. 9. Even when the undulations 42 are at least partly disposed in the frame region NA, the common layer 41 formed using the mask 71 as a CMM extends into the trench 21a to a smaller extent than the common layer 41 formed using the mask 81 as a CMM. This reduces the area of a region where the cathode 25 cannot be in contact with the routed wire DW.

The present embodiment consequently achieves a contact region between the cathode 25 and the routed wire DW while providing a margin between the opening end 72a of the mask 71 and the mask spacers 31. This embodiment thus oilers the display device 2 more reliable than ever before, the mask 71 with which such a more reliable display device 2 can be manufactured, and a method for manufacturing such a more reliable display device 2.

In this embodiment, the common layer 41 formed using the mask 71 can be a layer formed all over the pixel region DA rather than formed individually for each pixel. Examples of the common layer 41 include function layers (organic or inorganic layers) disposed in the EL layer 24, such as a hole injection layer, a common hole transport layer, a hole blocking layer, an electron transport layer, and an electron injection layer. As earlier described, the common layer 41 can also be a light-emitting layer that is formed using a CMM under conditions, such as where the light-emitting element ES is an OLED that emits white light, and where the light-emitting element ES is an OLED having a common light-emitting layer common to a plurality of pixels. The common layer 41 can also be a capping layer that is as large as the aforementioned function layer. Further, although sides of the cathode 25 defining the contact region in the frame region NA are not formed using the mask 71, a portion of the cathode 25 without such a contact region (sides without such a contact region) is formed using the mask 71.

FIG. 4 illustrates, by way of example only, that the undulations 73 are disposed at all the opening ends 72a of the mask 71. The undulations 73 may be disposed at part of the opening end 72a of the mask 71 as long as they are disposed at the opening ends 72a of the mask 71. That is, the undulations 73 need to be disposed at at least part (i.e., at least one of the sides) of the opening end 72a of the mask 71.

The disclosure is not limited to the foregoing embodiment and can be modified in various manners within the scope of the claims. The technical scope of the disclosure includes an embodiment that is obtained in combination as necessary with technical means disclosed in various embodiments. In addition, combining the technical means disclosed in the individual embodiments can form a new technical feature.

REFERENCE SIGNS LIST 2 display device
21a trench (contact region)
24 EL layer
25 cathode
31 mask spacer (pixel-region mask spacer)
32 mask spacer (frame-region mask spacer)
41 common layer
42, 73 undulations
71 mask
72 opening
72a opening end
DA pixel region
NA frame region

The invention claimed is:

1. A display device comprising:
a plurality of pixel-region mask spacers disposed in a pixel region in which a plurality of pixels is disposed;
a plurality of frame-region mask spacers disposed in a frame region outside the pixel region, such that to surround the pixel region; and
a common layer disposed on the plurality of pixel-region mask spacers, the common layer being common to the plurality of pixels,
wherein the common layer comprises an end that has undulations in a plan view,
at least part of the end of the common layer is located between the plurality of pixel-region mask spacers and the plurality of frame-region mask spacers in the plan view, and
the undulations comprise a plurality of depressions located, respectively, between the plurality of pixel-region mask spacers adjacent to the frame region.

2. The display device according to claim 1, wherein the plurality of depressions is separated from each other by a distance that is equal to a distance between each two adjacent pixel-region mask spacers of the plurality of pixel-region mask spacers.

3. The display device according to claim 1, wherein the undulations have a wavy shape.

4. The display device wherein the undulations are at least partly located in the frame region.

5. The display device according to claim 1, further comprising:
a plurality of first electrodes;
a second electrode common to the plurality of pixels; and
a function layer interposed between the plurality of first electrodes and the second electrode.

6. The display device according to claim 5, wherein the function layer is an organic layer.

7. A display device comprising:
a plurality of pixel-region mask spacers disposed in a pixel region in which a plurality of pixels is disposed;
a plurality of frame-region mask spacers disposed in a frame region outside the pixel region, such that to surround the pixel region; and
a common layer disposed on the plurality of pixel-region mask spacers, the common layer being common to the plurality of pixels,
wherein the common layer comprises an end that has undulations in a plan view,
at least part of the end of the common layer is located between the plurality of pixel-region mask spacers and the plurality of frame-region mask spacers in the plan view, and
the plurality of frame-region mask spacers is separated from each other by a distance that is smaller than a distance between each two adjacent pixel-region mask spacers of the plurality of pixel-region mask spacers.

8. A display device comprising:
a plurality of pixel-region mask spacers disposed in a pixel region in which a plurality of pixels is disposed;
a plurality of frame-region mask spacers disposed in a frame region outside the pixel region, such that to surround the pixel region;
a common layer disposed on the plurality of pixel-region mask spacers, the common layer being common to the plurality of pixels;
a plurality of first electrodes;
a second electrode common to the plurality of pixels; and
a function layer interposed between the plurality of first electrodes and the second electrode,
wherein the common layer comprises an end that has undulations in a plan view,
at least part of the end of the common layer is located between the plurality of pixel-region mask spacers and the plurality of frame-region mask spacers in the plan view, and wherein-the common layer having the undulations comprises the second electrode.

* * * * *